United States Patent
Chen et al.

(10) Patent No.: US 8,710,880 B2
(45) Date of Patent: Apr. 29, 2014

(54) POWER-ON RESET CIRCUIT

(71) Applicant: Anpec Electronics Corporation, Hsin-Chu (TW)

(72) Inventors: Chin-Hong Chen, Taichung (TW); Chieh-Wen Cheng, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 4 days.

(21) Appl. No.: 13/666,982

(22) Filed: Nov. 2, 2012

(65) Prior Publication Data

US 2014/0062535 A1    Mar. 6, 2014

(30) Foreign Application Priority Data

Aug. 28, 2012   (TW) .............................. 101131196 A

(51) Int. Cl.
*H03L 7/00* (2006.01)
(52) U.S. Cl.
USPC ............................................ 327/143; 327/77

(58) Field of Classification Search
USPC .......................... 327/77, 80, 81, 85, 143, 198
See application file for complete search history.

(56) References Cited

U.S. PATENT DOCUMENTS

| 7,348,816 B2 * | 3/2008 | Shin .............................. 327/143 |
| 2008/0122493 A1 * | 5/2008 | Jeon et al. ........................ 327/77 |
| 2011/0267115 A1 * | 11/2011 | Yamamoto et al. ........... 327/143 |

* cited by examiner

*Primary Examiner* — Long Nguyen
(74) *Attorney, Agent, or Firm* — Winston Hsu; Scott Margo

(57) ABSTRACT

A power-on reset circuit is disclosed. The power-on reset circuit includes a first resistor; a first transistor, including a first terminal coupled to a second terminal of the first resistor, and a control terminal for receiving a reference voltage; a second resistor, including a first terminal coupled to a second terminal of the first transistor; a second transistor, including a first terminal coupled to a second terminal of the first resistor, and a control terminal coupled to a second terminal of the second transistor and utilized for receiving an input voltage; and a comparator, including a first input terminal for receiving a comparison voltage, and a second input terminal for receiving the reference voltage, for generating a power-on reset signal according to the comparison voltage and the reference voltage.

5 Claims, 2 Drawing Sheets

POWER-ON RESET CIRCUIT

BACKGROUND OF THE INVENTION

1. Field of the Invention

The present invention relates to a power-on reset circuit, and more particularly, to a power-on reset circuit capable of performing power-on reset accurately with low power consumption.

2. Description of the Prior Art

In an electronic device, when power is turned on in the beginning, an input voltage is too low to provide circuits working correctly. Therefore, a power-on reset circuit is required to detect the input voltage and when the input voltage rises to be equal to a specific voltage capable of providing backend circuits working correctly, the power-on reset circuit generates a power-on reset signal to indicate backend circuits to start working.

For example, a conventional power-on reset circuit utilizes voltage dividing resistors to divide the input voltage and compares the division voltage of the input voltage with a reference voltage by a comparator. When the division voltage of the input voltage is greater than the reference voltage, a power-on reset signal, which is generated by the comparator, changes a state to indicate the backend circuits to start working.

Under such a structure, by utilizing the comparator for comparison, it can accurately indicate the backend circuits to start working when the input voltage reaches a preset specific voltage. However, since the voltage dividing resistors are utilized for dividing the input voltage, resistors of large resistance and consuming large layout area are required to avoid high power consumption due to large current during operations. Besides, a shut-down switch is required to be utilized in this structure to cut off all current when power is turned off. Thus, when the shut-down switch is turned on, an on-resistance is formed in the shut-down switch and results in a voltage difference, such that the comparator can not accurately indicate the backend circuits to start working when the input voltage reaches the preset specific voltage.

On the other hand, please refer to FIG. 1, which illustrates a schematic diagram of a conventional power-on reset circuit 10. In the power-on reset circuit 10, when an input voltage VIN is greater than a summation of a reference voltage VREF, a gate-to-drain voltage difference VGS3 of a transistor MP3, and a saturation voltage VDsat2 of a transistor MP2 (VIN>VREF+VGS3+VDsat2, i.e. a path P1), the transistor MP3 is turned on and transistors MN1 and MN2 are turned on as well. At this moment, an input terminal voltage of an inverter 102 is changed from the input voltage VIN with a high voltage level to a ground voltage with a low voltage level, so a power-on reset signal POR, which is outputted from the inverter 102, changes a state to indicate the backend circuits to start working.

Under such a structure, by utilizing a current mirror MP1, MP2 and MP4, and a current mirror MN1 and MN2 to mirror a current Iq, which is generated from a current source 100, to control the power-on reset signal POR to change a state, it does not require resistors of large resistance and consuming large layout area and can operate with small current to avoid high power consumption. However, due to the process variation of the transistors MP1, MP2, MP3, MP4, MN1, and MN2, the input voltage may not accurately reach a specific voltage capable of providing the backend circuits working correctly (i.e. VIN>VREF+VGS3+VDsat2) when the power-on reset signal POR changes a state, causing problems during operations.

In the prior art, the power-on reset circuit with the structure of the voltage dividing resistors and the comparator can accurately indicate the backend circuits to start working when the input voltage reaches the preset specific voltage, but resistors of large resistance and consuming large layout area are required. The power-on reset circuit with the structure of the current mirrors does not require large resistors consuming large layout area and can operate with small current, but the process variation of the transistors may cause the input voltage not accurately to reach the specific voltage capable of providing backend circuit working correctly when the power-on reset signal POR changes a state. Thus, there is a need for improvement of the prior art.

SUMMARY OF THE INVENTION

It is therefore an objective of the present invention to provide a power-on reset circuit capable of performing power-on reset accurately and having low power consumption.

The present invention discloses a power-on reset circuit. The power-on reset circuit includes a first resistor, comprising a first terminal and a second terminal, wherein the first terminal is coupled to a ground terminal, a first transistor, comprising a first terminal, a second terminal and a control terminal, wherein the first terminal of the first transistor is coupled to the second terminal of the first resistor, and the control terminal of the first transistor is utilized for receiving a reference voltage, a second resistor, comprising a first terminal and a second terminal, wherein the first terminal of the second resistor is coupled to the second terminal of the first transistor, a second transistor, comprising a first terminal, a second terminal, and a control terminal, wherein the first terminal of the second transistor is coupled to the second terminal of the second resistor, and the control terminal of the second transistor is coupled to the second terminal of the second transistor and is utilized for receiving an input voltage, and a comparator, comprising a first input terminal and a second input terminal, wherein the first input terminal is coupled between the first terminal of the second resistor and the second terminal of the first resistor for receiving a comparison voltage, the second input terminal is utilized for receiving the reference voltage, and the comparator is utilized for generating a power-on reset signal according to the comparison voltage and the reference voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
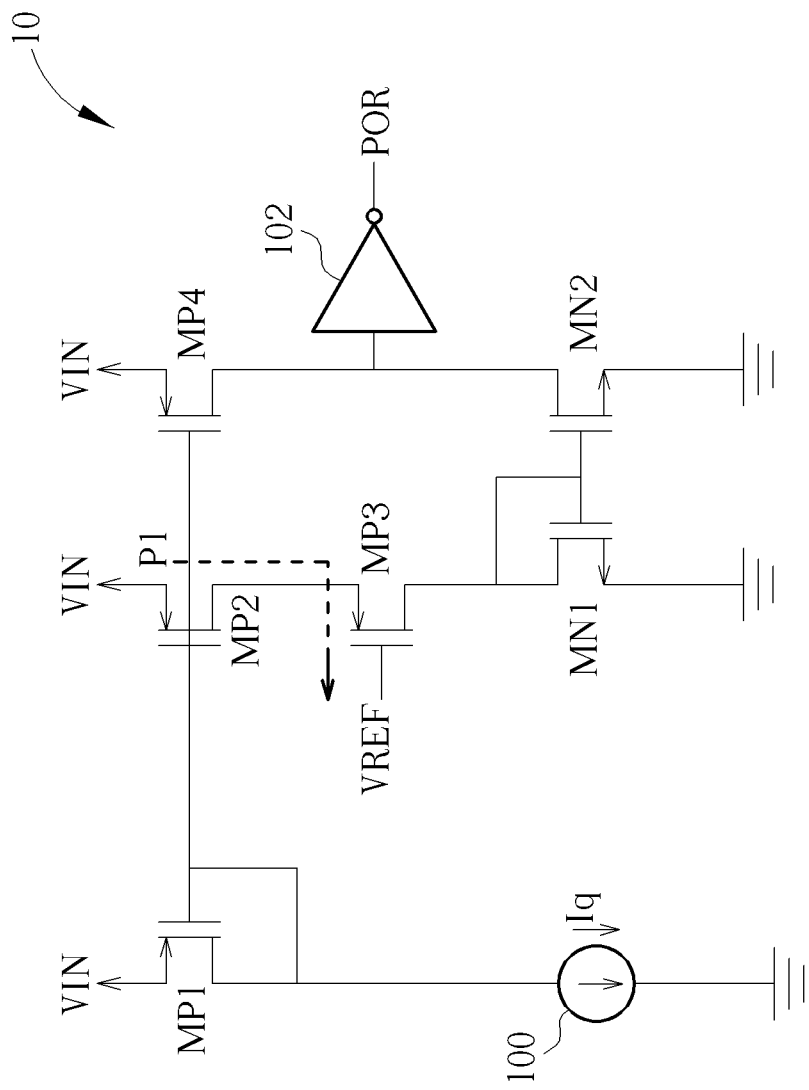
FIG. 1 illustrates a schematic diagram of a conventional power-on reset circuit.
Figure 2:
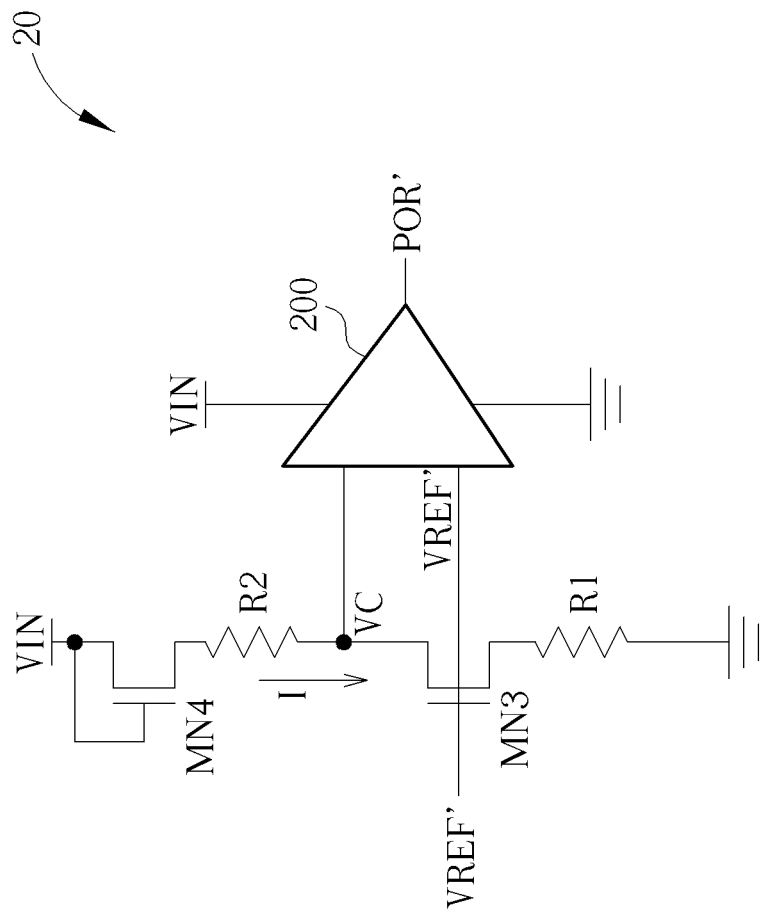
FIG. 2 illustrates a schematic diagram of a power-on reset circuit according to an embodiment of the present invention.

Please refer to FIG. 2, which illustrates a schematic diagram of a power-on reset circuit 20 according to an embodiment of the present invention. A power-on reset circuit 20 includes a resistor R1, a resistor R2, a transistor MN3, a transistor MN4, and a comparator 200. The detailed architecture and connection are shown in FIG. 2. A first terminal of the resistor R1 is coupled to a ground terminal. A first terminal (e.g. a source) of the transistor MN3 is coupled to a second terminal of the resistor R1, and a control terminal (e.g. a gate) of the transistors MN3 is utilized for receiving a reference voltage VREF'. A first terminal of the resistor R2 is coupled to a second terminal (e.g. a drain) of the transistor MN3. A first terminal of the transistor MN4 is coupled to a second terminal of the resistor R2, and a control terminal of the transistor MN4 is coupled to a second terminal of the transistor MN4 and is utilized for receiving an input voltage VIN. A first input terminal of the comparator 200 is coupled between the first terminal of the resistor R2 and the second terminal of the resistor MN3 for receiving a comparison voltage VC, and a second input terminal of the comparator 200 is utilized for receiving the reference voltage VREF'. The comparator 200 generates a power-on reset signal POR' according to the comparison voltage VC and the reference voltage VREF' (wherein the comparator 200 is driven by the input voltage VIN).

Under such a structure, a magnitude of a current I flowing through the resistors R1 and R2 is a value of the reference voltage VREF' minus a gate-to-source voltage difference VGS3' of the resistor MN3 and divided by the resistor R1 (i.e. I=(VREF'−VGS3')/R1), and thus a magnitude of the comparison voltage VC is a value of the input voltage VIN minus a gate-to-source voltage difference VGS4' of the resistor MN4 and minus a result of the resistor R2 multiplied the current I (i.e. VC=VIN−VGS4'−R2*(VREF'−VGS3')/R1). Thus, if the resistors R1 and R2 and the transistors MN3 and MN4 are properly designed to be matched (i.e. resistance of the resistor R1 is equal to resistance of the resistor R2 and the gate-to-drain voltage difference VGS3' is equal to the gate-to-drain voltage difference VGS4'), the comparison voltage VC becomes the input voltage VIN minus the reference voltage VREF (i.e. VC=VIN−VGS4'−(VREF'−VGS3')=VIN−VREF'), such that when power is turned on and the input voltage VIN rises to be equal to a specific voltage twice the reference voltage VREF', the power-on reset signal POR', which is generated by the comparator 200, changes a state to indicate backend circuits to start working.

In such a situation, in comparison with the conventional power-on reset circuit 10 with the structure of the current mirrors, since the power-on reset signal POR' is generated by utilizing the comparator 200 and the resistors R1 and R2 are the same type resistors of the same temperature coefficient, the reference voltage VREF' is not related to temperature, and the comparison for generating the power-on reset signal POR' can be much accurate. On the other hand, in comparison with the conventional power-on reset circuit with the structure of the voltage dividing resistors and the comparator, since the magnitude of the current I is related to the reference voltage VREF' and the resistor R1 (the reference voltage VREF' is smaller), the current I can be smaller during operations under the same resistors (the same layout area) to save power, and the resistors R1 and R2 can be smaller under the same current to save the layout area. Besides, the power-on reset circuit 20 can switch change the reference voltage VREF' to 0V to cut off the current when power is turned off. Therefore, no additional shut-down switch is required to be added and no on-resistance causes a voltage difference when the shut-down switch is turned on, such that the comparator 200 can accurately indicate the backend circuits to start working when the input voltage reaches a preset specific voltage. As a result, the present invention can accurately perform power-on reset and has low power consumption and smaller layout area.

Noticeably, the spirit of the present invention is to properly design the structure of the resistors R1, the resistor R2, the resistor MN3, and the resistor MN4 to generate the comparison voltage VC to accurately perform power-on reset with low power consumption and smaller layout area. Those skilled in the art can make modifications or alterations accordingly. For example, in the above embodiment, the transistors MN3 and MN4 are N-type metal oxide semiconductor (MOS) transistors and the first terminal, the second terminal and the control terminal of the transistors MN3 and MN4 are a source, a drain, and a gate. However, in other embodiment, P-type MOS transistors can also be implemented, as long as the connection of the transistors, the resistor R1, the resistor R2, the reference voltage VREF', and the input voltage VIN are modified to achieve the above effect. Besides, in the above embodiment, the resistance of the resistor R1 is designed to be equal to the resistance of the resistor R2, so when power is turned on and the input voltage VIN rises to be equal to the specific voltage twice the reference voltage VREF', the power-on reset signal, which is generated by the comparator 200, changes a state to indicate the backend circuits to start working. In other embodiment, the resistance of the resistors R1 and R2 can also be designed in other specific ratio, and when power is turned on and the input voltage VIN rises to be equal to a specific voltage (under such a situation, other than related to the reference voltage VREF', the specific voltage is also related to the gate-to-source voltage differences VGS3' and VGS4'), the power-on reset signal POR', which is generated by the comparator 200, changes a state to indicate the backend circuits to start working.

In the prior art, the power-on reset circuit with the structure of the voltage dividing resistors and the comparator can accurately indicate the backend circuits to start working when the input voltage reaches the preset specific voltage, but resistors of large resistance and consuming layout area are required; the power-on reset circuit with the structure of the current mirrors does not require large resistors consuming large layout area and can operate with small current, but the process variation of the transistors may cause the input voltage not accurately to reach a specific voltage capable of providing the backend circuits working correctly when the power-on reset signal POR changes a state. In comparison, the present invention can properly design the structure of the resistor R1, the resistor R2, the resistor MN3, and the resistor MN4 to generate the comparison voltage VC to accurately perform power-on reset with low power consumption and smaller layout area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power-on reset circuit, comprising:
 a first resistor, comprising a first terminal and a second terminal, wherein the first terminal is coupled to a ground terminal;
 a first transistor, comprising a first terminal, a second terminal and a control terminal, wherein the first terminal of the first transistor is coupled to the second terminal of the first resistor, and the control terminal of the first transistor is utilized for receiving a reference voltage;
 a second resistor, comprising a first terminal and a second terminal, wherein the first terminal of the second resistor is coupled to the second terminal of the first transistor;
 a second transistor, comprising a first terminal, a second terminal, and a control terminal, wherein the first terminal of the second transistor is coupled to the second terminal of the second resistor, and the control terminal of the second transistor is coupled to the second terminal of the second transistor and is utilized for receiving an input voltage; and a comparator, comprising a first input terminal and a second input terminal, wherein the first input terminal is coupled between the first terminal of the second resistor and the second terminal of the first resistor for receiving a comparison voltage, the second input terminal is utilized for receiving the reference voltage, and the comparator is utilized for generating a power-on reset signal according to the comparison voltage and the reference voltage.

2. The power-on reset circuit of claim 1, wherein resistance of the first resistor is equal to resistance of the second resistor.

3. The power-on reset circuit of claim 2, wherein when power is turned on and the input voltage rises to be equal to a specific voltage twice the reference voltage, the power-on reset signal changes a state to indicate backend circuits to start working.

4. The power-on reset circuit of claim 1, wherein the first transistor and the second transistor are N-type metal oxide semiconductor (MOS) transistors, and the first terminal, the second terminal and the control terminal of the first transistor and the second transistor are a source, a drain, and a gate.

5. The power-on reset circuit of claim 1, wherein when power is turned on and the input voltage rises to be equal to a specific voltage, the power-on reset signal changes a state to indicate backend circuit to start working.

\* \* \* \* \*